(12) United States Patent
Park et al.

(10) Patent No.: US 9,142,737 B2
(45) Date of Patent: Sep. 22, 2015

(54) LIGHT EMITTING DEVICE SURROUNDED BY REFLECTION WALL AND COVERED WITH FLUORESCENT FILM

(71) Applicant: SAMSUNG ELECTRONICS CO., LTD., Seoul (KR)

(72) Inventors: Na-Na Park, Seoul (KR); Il Woo Park, Suwon (KR); Chang Hoon Kwak, Seoul (KR)

(73) Assignee: SAMSUNG ELECTRONICS CO., LTD., Seoul (KR)

( * ) Notice: Subject to any disclaimer, the term of this patent is extended or adjusted under 35 U.S.C. 154(b) by 0 days.

(21) Appl. No.: 14/543,785

(22) Filed: Nov. 17, 2014

(65) Prior Publication Data

US 2015/0069454 A1    Mar. 12, 2015

Related U.S. Application Data

(63) Continuation of application No. 13/290,639, filed on Nov. 7, 2011, now Pat. No. 8,890,188.

(30) Foreign Application Priority Data

Nov. 10, 2010 (KR) .......................... 10-2010-0111706

(51) Int. Cl.
*H01L 33/60* (2010.01)
*H01L 33/50* (2010.01)
*H01L 33/48* (2010.01)
*H01L 33/62* (2010.01)

(52) U.S. Cl.
CPC ............ *H01L 33/507* (2013.01); *H01L 33/486* (2013.01); *H01L 33/60* (2013.01); *H01L 33/62* (2013.01); *H01L 33/505* (2013.01); *H01L 2224/48091* (2013.01); *H01L 2224/48247* (2013.01)

(58) Field of Classification Search
USPC ....................................................... 257/E33.07
See application file for complete search history.

(56) References Cited

U.S. PATENT DOCUMENTS 6,066,861 A    5/2000 Hohn et al.
6,372,608 B1    4/2002 Shimoda et al.
(Continued)

FOREIGN PATENT DOCUMENTS

CN    1515623 A    7/2004
CN    1667671 A    9/2005
(Continued)

OTHER PUBLICATIONS

Chinese Office Action dated Dec. 10, 2013 issued in Application No. 201110372560.6.
(Continued)

*Primary Examiner* — Stephen W Smoot
(74) *Attorney, Agent, or Firm* — McDermott Will & Emery LLP

(57) ABSTRACT

A light emitting device package includes: first and second electrodes, at least a portion of a lower surface thereof being exposed; a light emitting device disposed on an upper surface of at least one of the first and second electrodes; a reflection wall disposed on the upper surface of the first and second electrodes and surrounding the light emitting device to form a mounting part therein; and a fluorescent film disposed on the reflection wall to cover an upper portion of the mounting part. The mounting part is filled with air.

16 Claims, 4 Drawing Sheets

(56) References Cited

U.S. PATENT DOCUMENTS

| | | |
|---|---|---|
| 6,576,930 B2 | 6/2003 | Reeh et al. |
| 6,586,874 B1 | 7/2003 | Komoto et al. |
| 6,645,830 B2 | 11/2003 | Shimoda et al. |
| RE38,466 E | 3/2004 | Inoue et al. |
| 6,737,681 B2 | 5/2004 | Koda |
| 6,747,406 B1 | 6/2004 | Bortscheller et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,239,080 B2 | 7/2007 | Ng et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2001/0002049 A1 | 5/2001 | Reeh et al. |
| 2004/0257797 A1 | 12/2004 | Suehiro et al. |
| 2005/0051782 A1 | 3/2005 | Negley et al. |
| 2005/0093430 A1 | 5/2005 | Ibbetson et al. |
| 2005/0200269 A1 | 9/2005 | Ng et al. |
| 2007/0004065 A1 | 1/2007 | Schardt et al. |
| 2007/0075306 A1 | 4/2007 | Hayashi et al. |
| 2008/0169480 A1 | 7/2008 | Weng et al. |
| 2009/0323304 A1 | 12/2009 | Helbing |
| 2010/0127286 A1 | 5/2010 | Schmidt et al. |
| 2011/0037091 A1 | 2/2011 | Fushimi |

FOREIGN PATENT DOCUMENTS

| | | |
|---|---|---|
| CN | 1777999 A | 5/2006 |
| CN | 101129095 A | 2/2008 |
| EP | 1187228 A1 | 3/2002 |
| EP | 2068193 A2 | 6/2009 |
| JP | 10-319877 A | 12/1998 |
| JP | 2007-116138 A | 5/2007 |
| KR | 10-2008-0045880 A | 5/2008 |
| KR | 10-2009-0058169 A | 6/2009 |
| WO | 2009008210 A1 | 1/2009 |

OTHER PUBLICATIONS

European Searh Report issued in European Application No. 11188523.2 dated May 14, 2014.

LIGHT EMITTING DEVICE SURROUNDED BY REFLECTION WALL AND COVERED WITH FLUORESCENT FILM

CROSS-REFERENCE TO RELATED APPLICATIONS

This application is a continuation of U.S. patent application Ser. No. 13/290,639, filed Nov. 7, 2011, now U.S. Pat. No. 8,890,188, which claims the priority of Korean Patent Application No. 10-2010-0111706, filed on Nov. 10, 2010, the disclosures of which are incorporated herein by reference.

BACKGROUND OF THE INVENTION

1. Field of the Invention

The present invention relates to a light emitting device package and a manufacturing method thereof.

2. Description of the Related Art

A light emitting diode, a sort of light source, is a device capable of generating light of various colors according to electron hole recombination in p and n type semiconductor junction parts when current is applied thereto.

A general method for manufacturing a light emitting device package is mounting a light emitting diode (LED) element on a package main body, filling a space between the surface of the LED element and the package main body with a molding resin including phosphors distributed therein, and hardening (or curing) the molding resin.

However, in the light emitting device package using the molding resin, light emitted to the side reacts greatly with phosphors, increasing red and greenish yellow light, so that the absorption and emission phenomenon causes light of an undesired wavelength to be generated and emitted according to an emission direction. Also, because a process of injecting a molding resin into each of the light emitting device packages is required, production time is increased, and because the phosphors distributed in the molding resin is precipitated and the degree of phosphor distribution varies depending on heat distribution during a heat curing process, the quality of a product may be degraded.

SUMMARY OF THE INVENTION

An aspect of the present invention provides a light emitting device package which has improved color deviation characteristics, can be fabricated in a reduced process, and has improved luminous efficiency.

According to an aspect of the present invention, there is provided a light emitting device package including: first and second electrodes, at least a portion of a lower surface thereof being exposed; a light emitting device disposed on an upper surface of at least one of the first and second electrodes; a reflection wall disposed on the upper surface of the first and second electrodes and surrounding the light emitting device to form a mounting part therein; and a fluorescent film disposed on the reflection wall to cover an upper portion of the mounting part.

At least portions of the first and second electrodes, the reflection wall, and the fluorescent film may be coplanar to form a side.

The light emitting device may be electrically connected to the first and second electrodes through conductive wires.

The light emitting device may be electrically connected to the first and second electrodes through a soldering layer.

A plurality of light emitting devices may be disposed and electrically connected to each other through the first and second electrodes, and the reflection wall may surround each of the plurality of light emitting devices to form a plurality of mounting parts.

The first and second electrodes may be spaced apart from one another and a light reflective part may be formed in the space between the first and second electrodes.

The light reflective part may be made of the same material as that of the reflection wall.

The fluorescent film may be formed by stacking a plurality of films.

The fluorescent film may convert light emitted from the light emitting device such that the light has at least one wavelength among yellow, red, and green.

The fluorescent film may be configured to include an encapsulant and phosphors mixed in the encapsulant.

The reflection wall may surround the light emitting device, and have a rectangular shape.

The first and second electrodes may be made of a material having light transmittance properties.

The reflection wall may be made of a material obtained by adding a dispersing agent to silicon.

The mounting part is filled with air.

At least a portion of the fluorescent film may be bonded to the light emitting device.

According to another aspect of the present invention, there is provided a method for manufacturing a light emitting device package, including: preparing a fluorescent film with phosphors dispersed therein; forming first and second electrodes; forming a reflection wall on at least a portion of an upper surface of each of the first and second electrodes to form a mounting part surrounded by the reflection wall, an upper portion of the mounting part being connected to the exterior; disposing a light emitting device at the inner side of the mounting part; and bonding the fluorescent film on the reflection wall to cover the upper portion of the mounting part.

The preparing of the fluorescent film may include: preparing first and second films; mixing a first liquid encapsulant and phosphors to prepare a mixed encapsulant; forming the mixed encapsulant to have a uniform thickness on the first film; attaching the second film to the surface of the mixed encapsulant formed on the first film; and keeping the first and second film-attached mixed encapsulant in storage in a refrigerated or frozen state.

The bonding of the fluorescent film to the reflection wall may include: eliminating the first or second film; attaching the mixed encapsulant to the reflection wall; and curing the mixed encapsulant to bond the cured mixed encapsulant to the reflection wall.

The preparing of the fluorescent film may include: preparing a film; mixing a second liquid encapsulant with phosphors to prepare a mixed encapsulant; forming the mixed encapsulant to have a uniform thickness on the film; and curing the mixed encapsulant.

In the bonding of the fluorescent film to the reflection wall, the cured mixed encapsulant may be bonded to the reflection wall through an adhesive.

The bonding of the fluorescent film may include: preparing the first and second films; mixing an encapsulant including a UV hardener with phosphors to prepare a mixed encapsulant; forming the mixed encapsulant to have a uniform thickness on the first film; attaching the second film to a surface of the mixed encapsulant formed on the first film; and keeping the mixed encapsulant having the first and second films attached thereto in storage in a refrigerated or frozen state.

The bonding of the fluorescent film to the reflection wall may include: eliminating the first or second film; attaching the mixed encapsulant to the reflection wall; and bonding the mixed encapsulant to the reflection wall through a UV curing process.

The method may further include: cutting an area in which the first and second electrodes, the reflection wall, and the fluorescent film overlap to be coplanar to obtain one or more light emitting device packages.

The obtained light emitting device packages may be cut such that the plurality of light emitting devices are disposed and electrically connected to each other through the first and second electrodes and the plurality of mounting parts formed as the reflection wall surrounds each of the plurality of light emitting devices are included.

In the forming of the mounting part, the reflection wall may surround the light emitting device, and have a rectangular shape.

The light emitting device may include one or more light emitting devices each generating blue, red, and green UV wavelength.

The phosphors may convert a wavelength into at least one of yellow, red, and green.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
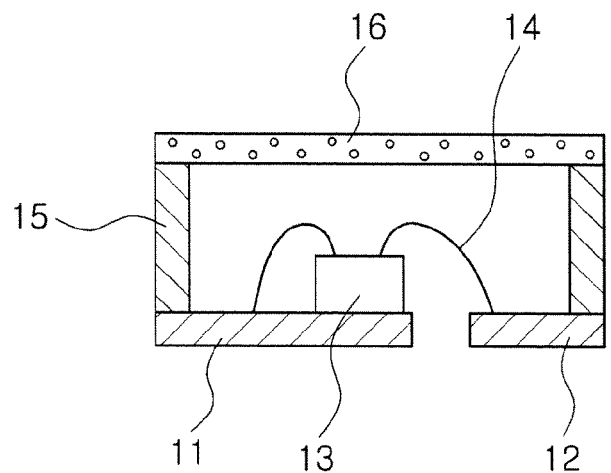
FIG. 1 is a schematic sectional view of a light emitting device package according to an exemplary embodiment of the present invention.

Exemplary embodiments of the present invention will now be described in detail with reference to the accompanying drawings.

The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

FIG. 1 is a schematic sectional view of a light emitting device package according to an exemplary embodiment of the present invention.

With reference to FIG. 1, a light emitting device package according to an exemplary embodiment of the present invention includes first and second electrodes 11 and 12 having an exposed lower surface, a light emitting device 13 disposed on the first electrode 11, a reflection wall 15 disposed on a portion of the upper surface of the first and second electrodes 11 and 12 and surrounding the light emitting device 13 to form a mounting part, and a fluorescent film 16 supported by the reflection wall 15 and covering an upper portion of the mounting part. The mounting part may be provided such that the interior thereof is charged with air. Hereinafter, the elements constituting the light emitting device package and coupling relations of the elements will now be described in detail with reference to FIG. 1.

The first and second electrodes 11 and 12 may be provided such that they are electrically connected with the light emitting device 13 and their lower surface is exposed in order to easily supply power applied from the exterior thereto. Preferably, the first and second electrodes 11 and 12 may be provided in the form of a large plate. More preferably, the first and second electrodes 11 and 12 may have a rectangular shape when viewed from an upper side. The first and second electrodes 11 and 12 are formed to be spaced apart. For example, when viewed from above, the first and second electrodes 11 and 12 have a rectangular shape and are disposed to be parallel and to face each other. Accordingly, the first and second electrodes 11 and can be physically separated to be insulated, and preferably, a light reflective part may be formed therebetween to obtain an additional technical effect, details of which will be described later.

The light emitting device 13 may be disposed on the first electrode 11. In the present exemplary embodiment, the light emitting device 13 is electrically connected to the first and second electrodes 11 and 12 through two conductive wires 14. However, the present invention is not limited thereto and the light emitting device 13 may be electrically connected to the first and second electrodes 11 and 12 through a single conductive wire or connected by a soldering layer, or the light emitting device 13 itself may be directly electrically connected to the first and second electrodes 11 and 12 according to embodiments.

The reflection wall 15 is formed on the first and second electrodes 11 and 12 to form the side of the light emitting device package, encompassing the light emitting device 13. In this case, preferably, the reflection wall 15, having a rectangular shape when viewed from above, is configured as a wall body surrounding the four sides to form a certain space therein. This configuration leads to the obtainment of an advantageous effect in producing a plurality of light emitting devices 13, details of which will be described later. Also, in the present exemplary embodiment, the reflection wall 15 is illustrated to have a uniform width through the height, but the present invention is not necessarily limited thereto, and various types of reflection walls can be formed according to embodiments.

Also, the reflection wall 15 may be formed, for example, through injection molding by adding a dispersing agent to silicon, or may be formed by using any other conventionally known methods.

The fluorescent film 16 is formed on the reflection wall 15 to cover the space formed as the reflection wall 15 surrounds the light emitting device 13, whereby light upwardly emitted by the light emitting device 13 or light reflected from the reflection wall 13 is made incident so as to be diffused through phosphors distributed or dispersed therein. Namely, the fluorescent film 16 is disposed to be supported by the wall body formed by the reflection wall 15. Because only the portion, of the fluorescent film 16, which is bonded to the reflection wall is supported by the reflection wall, preferably, the fluorescent film 16 itself needs to have a suitable strength and the space formed to be surrounded by the reflection wall 16 needs to have a suitable width in order to sufficiently guarantee the durability of the semiconductor package.

Also, the fluorescent film 16 may be formed by stacking a plurality of films and convert the wavelength of light emitted from the light emitting device. Also, for example, the fluorescent film 16 may be provided in such a form that it includes an encapsulant and phosphors mixed in the encapsulant. A detailed configuration of the fluorescent film will be described in detail in explaining a method for manufacturing the fluorescent film.

By employing the configuration using the fluorescent film 16, the present invention can obtain the effect of reducing a color deviation as compared with the related art. Namely, in the related art light emitting device package, because a surrounding area of the light emitting device is sealed with a molding resin, the degree of a distribution of phosphors varies according to heat applied to the molding resin during a heat curing process, causing the color deviation, but the present invention does not have such a problem because the molding resin is not used in the present invention.

Also, the sides of the first and second electrodes 11 and 12, the side of the reflection wall 15, and the side of the fluorescent film 16 constitute the sides of the light emitting device package, and in the present exemplary embodiment, the sides of the three types of elements (or constituents) may be formed to be coplanar. In detail, the first and second electrodes 11 and 12, the reflection wall 15, and the fluorescent film 16 are sequentially stacked and an area in which the three types of elements overlap is cut in a vertical direction, so as to be provided in a coplanar manner. Accordingly, the light emitting device package can be formed with a side having a uniform shape, so it can be advantageous for a mass-production and, in terms of a light extraction efficiency, the influence of an unintended diffused reflection, a refraction, or the like, can be minimized to allow for the manufacturing of a high quality light emitting device package.

Light emitting device packages according to various exemplary embodiments of the present invention will now be described in detail.

FIGS. 2 to 5 are schematic sectional views of the light emitting device package according to an exemplary embodiment of the present invention.

Figure 2:
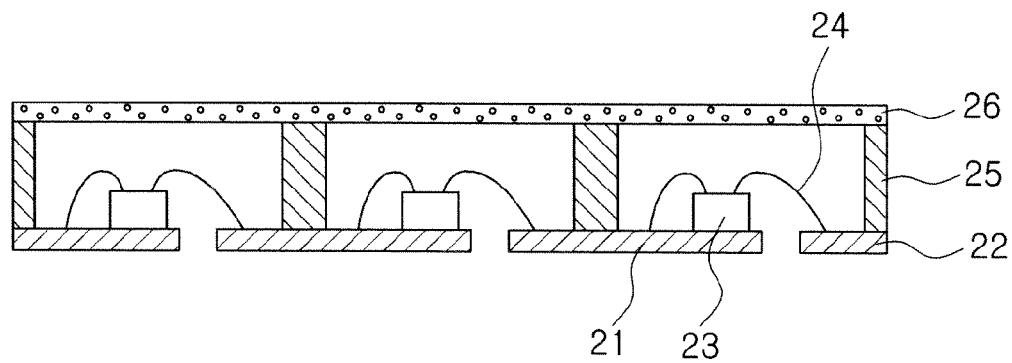
FIGS. 2 to 5 are schematic sectional views of the light emitting device package according to an exemplary embodiment of the present invention.

With reference to FIG. 2, a light emitting device package according to the present exemplary embodiment is configured such that a plurality of light emitting devices 23 are disposed in an array in a lengthwise direction and are electrically connected to each other through first and second electrodes 21 and 22, and the reflection walls 25 form a plurality of mounting parts surrounding the plurality of light emitting devices 23, respectively. In detail, a second electrode electrically connected to a particular light emitting device is defined as a first electrode in a light emitting device which is adjacent to the particular light emitting device and is electrically connected thereto. Namely, the first and second electrodes 21 and 22 may serve as passages of current connecting in series the light emitting device packages arranged in the lengthwise direction.

Preferably, the first and second electrodes 21 and may be regularly arranged in rows and columns, and accordingly, light emitting device packages can be simultaneously manufactured in rows and columns in a large area, thus enhancing production efficiency.

Also, the reflection wall can be shared by one light emitting device package 23 and a neighboring light emitting device package 23, and a fluorescent film 26 may be provided in the form of a single film covering the entirety of the light emitting device packages.

Figure 3:
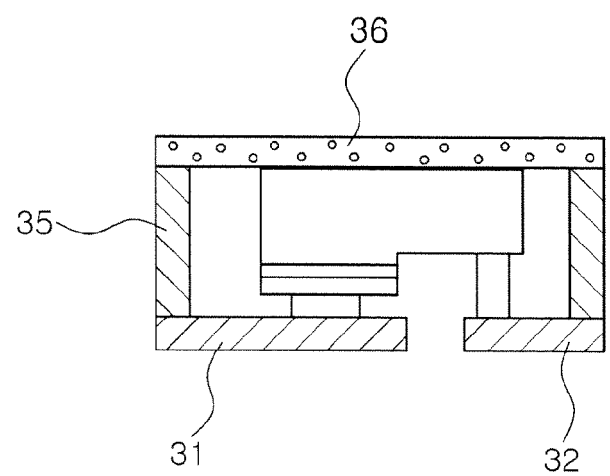

With reference to FIG. 3, in a light emitting device package according to an exemplary embodiment of the present invention, in order to improve light extraction efficiency, a light emitting device may have two electrodes formed on a lower surface thereof and connected to first and second electrodes 31 and 32, respectively. Alternatively, the light emitting device may have one electrode on one side thereof and another on the other opposing side. Namely, the light emitting device package according to the present exemplary embodiment is not limited to being applied to a particular type of light emitting device but can be applicable to various types of light emitting devices so long as the first and second electrodes 31 and 32 are electrically connected with the electrodes of the light emitting device.

In this case, the fluorescent film 36 may be directly bonded to the surface of the semiconductor light emitting device to firmly fix the package and realize an even light distribution.

Figure 4:
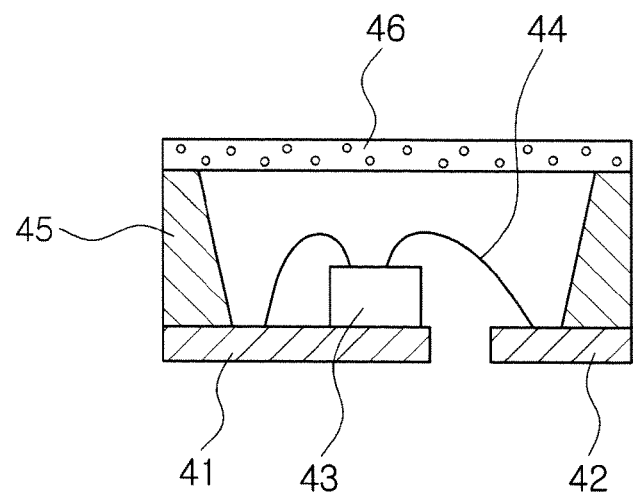

With reference to FIG. 4, in a light emitting device package according to an exemplary embodiment of the present invention portions, a reflection wall 45 may be configured such that portions thereof which are close to first and second electrodes 41 and 42 have a larger width and the width of the reflection wall is diminished toward an upper side, allowing light emitted from a light emitting device 43 to be easily reflected and emitted to an upper side of the light emitting device package. However, the section does not necessarily have a trapezoid shape and, for example, the light emitting device 43 may be formed to have a side having a gentle semi-parabolic shape based on the area, where the light emitting device is formed, as the focus thereof, so long as it can easily reflect side light emitted from the light emitting device 43.

Figure 5:
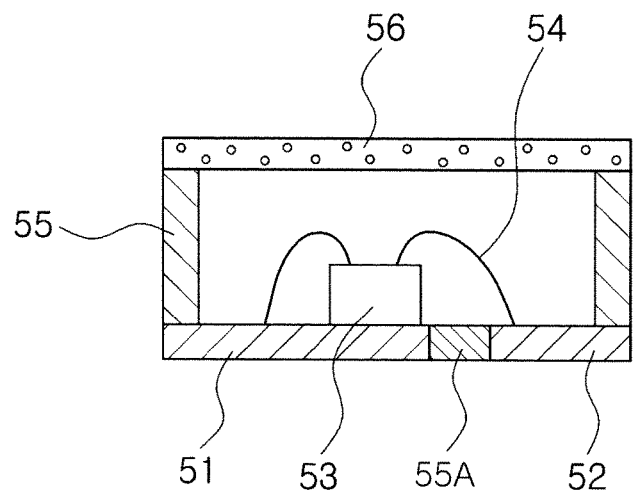

With reference to FIG. 5, in a light emitting device package according to an exemplary embodiment of the present invention, first and second electrodes 51 and 52 are spaced apart from one another and a light reflective part 55A may be provided in the space between the first and second electrodes 51 and 52. Accordingly, because the light reflective part 55A reflects light, light extraction efficiency can be further improved compared to the case in which the light reflective part 55A is not provided.

Preferably, the light reflective part 55A may be made of the same material as that of a reflection wall 55, and in this case, the reflection wall 55 and the light reflective part 55A can be simultaneously formed, rather than in separate processes, to thus simplify the manufacturing process.

Figure 6A:
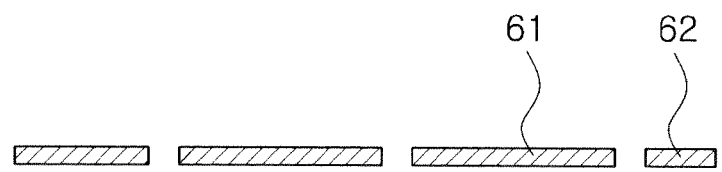
FIGS. 6A to 6E are sectional views showing a sequential process for a method for manufacturing a light emitting device package according to an exemplary embodiment of the present invention.
Figure 6B:
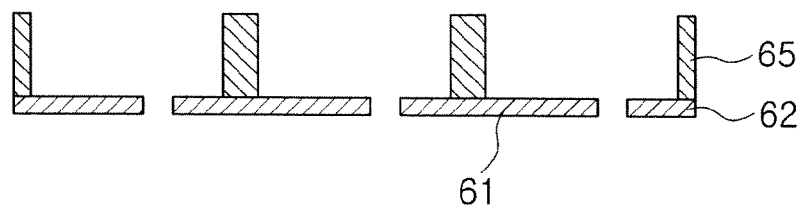
Figure 6C:
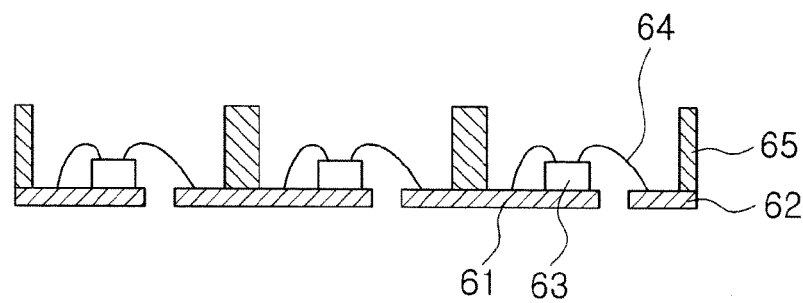
Figure 6D:
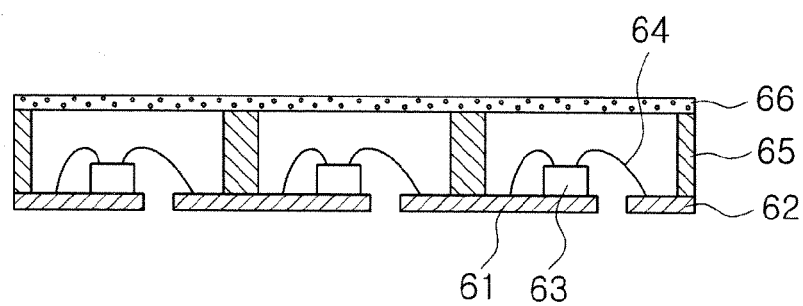
Figure 6E:
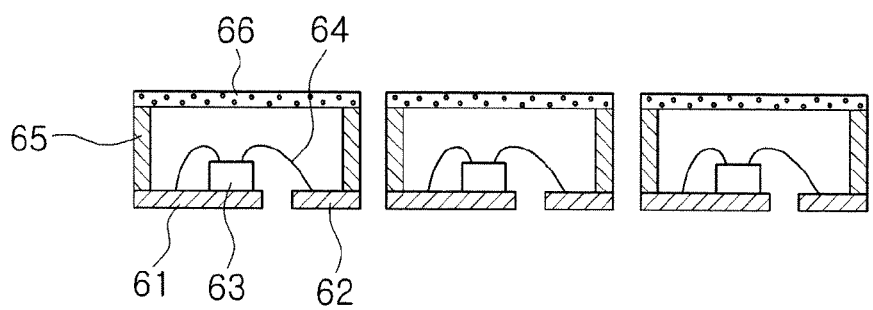

FIGS. 6A to 6E are sectional views showing the sequential processes of a method for manufacturing a light emitting device package according to an exemplary embodiment of the present invention. Specifically, FIG. 6A shows a process of forming first and second electrodes, FIG. 6B shows a process of forming a reflection wall on the first and second electrodes, FIG. 6C shows a process of mounting a light emitting device on the first and second electrodes, FIG. 6D shows a process of bonding a fluorescent film on the reflection wall, and FIG. 6E shows a process of cutting the reflection wall in a thickness-wise direction to obtain one or more light emitting device packages.

First, with reference to FIG. 6A, the method for manufacturing a light emitting device package according to an exemplary embodiment of the present invention may include a process of forming first and second electrodes 61 and 62 on a plane. In this case, the expression of 'first and second' is based on a pair of electrodes positioned at the far right on the drawings to help understand the present invention, and it is appreciated that the pair of electrodes represent all the first and second electrodes defined in each of the light emitting device package.

Also, the first and second electrodes 61 and 62 may be configured to be spaced apart by a certain distance between a plurality of plated sheets forming a rectangular shape when viewed from above, and the configuration is repeated. The first and second electrodes 61 and 62 may have the same shape and be arranged in a lengthwise direction, forming a certain pattern. Preferably, the first and second electrodes 61 and 62 are disposed in rows and columns.

Also, in order to form the first and second electrodes 61 and 62, a substrate may be formed and the first and second electrodes 61 and 62 may be formed on the substrate.

Next, with reference to FIG. 6B, a reflection wall 65 may be formed on the first and second electrodes 61 and 62, and in this case, the reflection wall 65 may have a shape of an surrounding wall face to form a certain space on an inner side thereof. Preferably, the reflection wall 65 may be provided to have a rectangular shape when viewed from above. Preferably, the reflection wall 65 may be formed to have the same pattern corresponding to the first and second electrodes 61 and 62. Although not shown, a process of additionally forming a light reflective part having the same material as that of the reflective wall 65 in the space between the first and second electrodes 61 and 62 may be performed.

And then, as shown in FIG. 6C, the light emitting device 63 is mounted on the first and second electrodes 61 and 62. In this case, preferably, a single light emitting device 63 is mounted in the space surrounded by the reflection wall 65. With such a configuration, a light emitting device package including the first and second electrodes 61 and 62, the reflection wall 65, and the light emitting device 63 mounted in the space formed to be surrounded by the reflection wall 65 can be independently configured.

Also, in the present exemplary embodiment, the configuration in which the light emitting device has two electrodes formed on one surface thereof and the two electrodes of the light emitting device and the first and second electrodes 61 and 62 are electrically connected by conductive wires is illustrated, but the present invention is not limited thereto and the light emitting device may have various forms and include various electrical connection means.

Thereafter, as shown in FIG. 6D, a fluorescent film 66 may be bonded to the reflection wall 65 to cover the upper portion of the mounting part. Here, the fluorescent film 66 may be an integrally formed single fluorescent film, and accordingly, the fluorescent film 66 can be attached through a single process and can be firmly attached to the reflection wall 65.

Subsequently, with reference to FIG. 6E, the area in which the reflection wall 65 is formed is cut in a thicknesswise direction to obtain one or more light emitting device packages. In this case, preferably, the cut section has a linear shape perpendicular to the first and second electrodes 61 and 62. Preferably, the area may be cut such that the first and second electrodes 61 and 62, the reflection wall 65, and the fluorescent film 66 are coplanar to form the side of each of the light emitting device packages. Accordingly, the respective light emitting device packages obtained through the process can have a uniform and standardized shape.

In the light emitting device packages obtained through the foregoing process, because the fluorescent film 66 is used, rather than filling the interior with a molding resin, a color deviation problem otherwise caused by heat generated in the process can be solved, and because the first and second electrodes 61 and 62, the reflection wall 65, and the fluorescent film 66 are fabricated to have the plurality of patterns at a time and then cut at certain intervals, production efficiency can be improved compared with the case in which packages are individually produced.

Figure 7A:
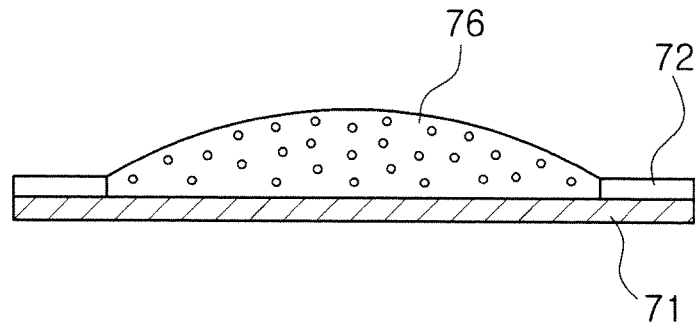
FIGS. 7A to 7C are sectional views showing a sequential process for a method for manufacturing a fluorescent film (or a photoluminescent film) of the light emitting device package according to an exemplary embodiment of the present invention.
Figure 7B:
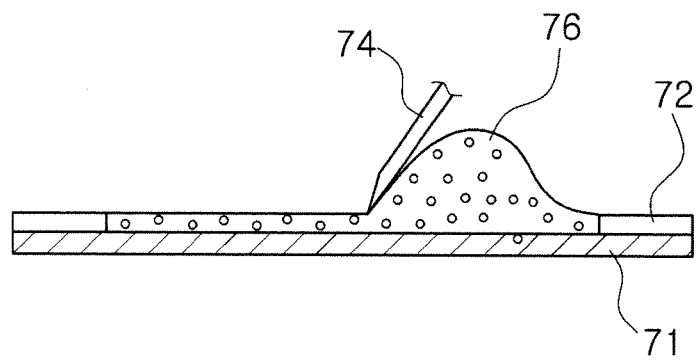
Figure 7C:
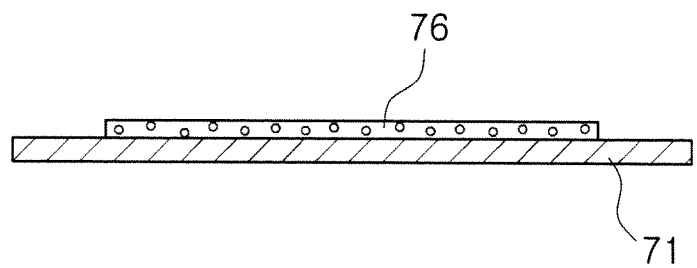

FIGS. 7A to 7C are sectional views showing the sequential processes of a method for manufacturing a fluorescent film (or a photoluminescent film) of the light emitting device package according to an exemplary embodiment of the present invention.

First, as shown in FIG. 7A, a film 71 to be used for forming a fluorescent film is prepared, and then, a mask 72 with an opening formed to correspond to the area of the film 71 in which the fluorescent film is to be formed is prepared. A mixed encapsulant 76 including phosphors is applied to the film 71 exposed by the mask 72 through a dispensing method, or the like.

In the present exemplary embodiment, the mixed encapsulant 76 may be provided as a mixture in which phosphors is mixed in a second liquid encapsulant. Here, the second liquid encapsulant refers to an encapsulant including a thermosetting resin, which may include at least one of epoxy, silicon, deformed (or changed) silicon, a urethane resin, an oxetane resin, acryl, polycarbonate, and polyimide.

Next, as shown in FIG. 7B, the surface of the mixed encapsulant 76 applied to the film 71 is pushed to be flattened by using a doctor blade 74 such that the thickness of the mixed encapsulant 76 applied to the film is uniform.

And then, as shown in FIG. 7C, the mixed encapsulant 76 applied to have a uniform thickness on the film 71 is cured (or hardened), and the mask 72 is eliminated to fabricate a fluorescent film in which phosphors is uniformly dispersed or distributed.

As mentioned above, the fluorescent film fabricated thusly is attached to the reflection wall or on the light emitting device, and in this case, the fluorescent film may be attached by using an adhesive, or the like.

Meanwhile, besides the second liquid encapsulant, a first liquid encapsulant not including a hardener or a UV encapsulant including a UV hardener may be used as the mixed encapsulant 76 to be used to fabricate the fluorescent film.

When the first liquid encapsulant or the mixed encapsulant is used, the mixed encapsulant applied to the film is not immediately cured but another film is disposed on the surface thereof, which is then kept to be refrigerated or frozen. Afterwards, the film is eliminated, the mixed encapsulant is attached to the reflection wall or to the light emitting device and is then bonded with the encapsulant through a heat curing process.

In case of the mixed encapsulant including the UV encapsulant, the mixed encapsulant may be attached to the reflection wall or on the light emitting device through a UV curing process.

In the present exemplary embodiment, the fluorescent film is formed by using a mask, but without using a mask, a large fluorescent film may be fabricated and cut into a required size and used as easily understood by a person skilled in the art.

As described above, in the present invention, phosphors is fabricated in the form of a film and then attached to the reflection wall or on the light emitting device. Thus, because the phosphors can be uniformly distributed, color uniformity can be improved. Namely, in the related art, the encapsulant is formed through a dispensing method, phosphors mixed in a transparent resin precipitates, resulting in non-uniform density of phosphors in the encapsulant to degrade color uniformity. However, in the present invention, because the fluorescent film is fabricated in the form of a sheet, precipitation of phosphors in the fluorescent film is fundamentally prevented. Also, because the phosphors are evenly distributed in the film, color uniformity can be improved and color reproducibility (i.e., a color reproduction or a color gamut) can be increased.

As set forth above, according to exemplary embodiments of the invention, when the light emitting device package and a manufacturing method thereof are used, the color deviation characteristics can be improved, the number of processes can be reduced, and luminous efficiency can be improved.

While the present invention has been shown and described in connection with the exemplary embodiments, it will be apparent to those skilled in the art that modifications and variations can be made without departing from the spirit and scope of the invention as defined by the appended claims.

What is claimed is:

1. A light emitting device package comprising:
    a light emitting device having a top surface, a bottom surface, and a side surface;
    a reflection wall surrounding the light emitting device, an inner surface of the reflection wall substantially parallel to the side surface;
    first and second electrodes spaced apart from one another and electrically connected to the light emitting device;
    a fluorescent film disposed on the reflection wall at least a portion of the fluorescent film is bonded to the light emitting device, a size of the fluorescent film is substantially equal to the light emitting device package.

2. The light emitting device package of claim 1, wherein the reflection wall and the fluorescent film are coplanar to form a side.

3. The light emitting device package of claim 1, wherein the light emitting device is electrically connected to the first and second electrodes through conductive wires.

4. The light emitting device package of claim 1, wherein the light emitting device is electrically connected to the first and second electrodes through a soldering layer.

5. The light emitting device package of claim 1, wherein a plurality of light emitting devices are disposed and electrically connected to each other through the first and second electrodes, and the reflection wall surrounds each of the plurality of light emitting devices to fo in a plurality of mounting parts.

6. The light emitting device package of claim 1, wherein a light reflective part is formed in the space between the first and second electrodes.

7. The light emitting device package of claim 6, wherein the light reflective part is made of the same material as that of the reflection wall.

8. The light emitting device package of claim 1, wherein the fluorescent film is formed by stacking a plurality of films.

9. The light emitting device package of claim 1, wherein the fluorescent film converts light emitted from the light emitting device such that the light has at least one wavelength among yellow, red, and green.

10. The light emitting device package of claim 1, wherein the fluorescent film is configured to include an encapsulant and phosphors mixed in the encapsulant.

11. The light emitting device package of claim 1, wherein the reflection wall surrounds the light emitting device, and has a rectangular shape.

12. The light emitting device package of claim 1, wherein the fluorescent film is bonded to a top surface of the reflection wall.

13. The light emitting device package of claim 1, wherein the reflection wall is made of a material obtained by adding a dispersing agent to silicon.

14. The light emitting device package of claim 1, wherein at least a portion of a lower surface of the first and second electrodes is exposed.

15. A light emitting device package comprising:
    a light emitting device having a top surface, a bottom surface, and a side surface;
    a reflection wall surrounding the light emitting device, and having an uniform width through the height;
    first and second electrodes spaced apart from one another and electrically connected to the light emitting device;
    a fluorescent film disposed on the reflection wall at least a portion of the fluorescent film is bonded to the light emitting device, a size of the fluorescent film is substantially equal to the light emitting device package.

16. The light emitting device package of claim 15, wherein at least a portion of a lower surface of the first and second electrodes is exposed.

* * * * *